United States Patent [19]
Taraci et al.

[11] Patent Number: 5,297,621
[45] Date of Patent: Mar. 29, 1994

[54] METHOD AND APPARATUS FOR MAINTAINING ELECTRICALLY OPERATING DEVICE TEMPERATURES

[75] Inventors: Richard Taraci, Phoenix, Ariz.; Brian Taraci, Laguna Niguel, Calif.; Imre Gorgenyi, Scottsdale, Ariz.

[73] Assignee: American Electronic Analysis, Phoenix, Ariz.

[21] Appl. No.: 835,711

[22] Filed: Feb. 12, 1992

Related U.S. Application Data

[60] Division of Ser. No. 633,382, Dec. 20, 1990, Pat. No. 5,099,908, which is a continuation-in-part of Ser. No. 379,083, Jul. 13, 1989, Pat. No. 5,004,973.

[51] Int. Cl.$^5$ .................. H01L 23/44; G01R 31/02
[52] U.S. Cl. .................. 165/104.13; 165/13; 324/158 F; 361/699
[58] Field of Search .......... 165/104.13, 104.33, 165/13.1; 361/385; 324/158 F

[56] References Cited

U.S. PATENT DOCUMENTS

| | | | |
|---|---|---|---|
| 3,406,244 | 10/1968 | Oktay | 165/104.13 |
| 4,050,507 | 9/1977 | Chu et al. | 165/1 |
| 4,741,385 | 5/1988 | Bergles et al. | 165/1 |
| 4,745,354 | 5/1988 | Fraser | 165/104.33 |
| 4,779,424 | 10/1988 | Sumitomo et al. | 165/104.13 |

FOREIGN PATENT DOCUMENTS 818281 8/1959 United Kingdom ........... 165/104.13

OTHER PUBLICATIONS

Yokouchi et al, K. *Immersion Cooling for High Density Packaging* IEEE Transactions on Components, Hybrids and Manufacturing Technology vol. CHMT-12, No. 4, Dec. 1987, pp. 643-646.

Shock, R. A. W. *Nucleate Boiling in Binary Mixtures*, Int. Journal Heat Mass Transfer, vol. 20, pp. 701-709, Pergamon Press, 1977.

*Primary Examiner*—Albert W. Davis, Jr.
*Attorney, Agent, or Firm*—Cahill, Sutton & Thomas

[57] ABSTRACT

A method and apparatus for maintaining an electrically operating device at a desired temperature during burn-in testing of the device includes immersing the device in a bath of an inert liquid having a boiling point less than the desired case temperature. The device generates heat during electrical operation which is transferred to the bath by nucleate boiling of the liquid. The device temperature is monitored until it stabilizes at a temperature between the boiling point of the liquid and the desired device temperature. An inert liquid having a boiling point greater than the desired devise temperature is slowly added to the bath to modify the rate of nucleate boiling of the lower-boiling liquid, while the device temperature is simultaneously monitored, until the case temperature reaches the desired device temperature.

5 Claims, 3 Drawing Sheets

METHOD AND APPARATUS FOR MAINTAINING ELECTRICALLY OPERATING DEVICE TEMPERATURES

This application is a division of Ser. No. 633,382, filed Dec. 20, 1990, now U.S. Pat. No. 5,099,908, which is a continuation-in-part of Ser. No. 379,083, filed Jul. 13, 1989, now U.S. Pat. No. 5,004,973.

This application also relates to Ser. No. 633,381, filed Dec. 20, 1990, now U.S. Pat. No. 5,119,021, which is a continuation of Ser. No. 379,083, filed Jul. 13, 1989, now U.S. Pat. No. 5,004,973.

FIELD OF THE INVENTION

The invention relates generally to a method and apparatus for maintaining an immersed electrically operating device at a desired temperature by controlling the rate of nucleate boiling of the immersion liquid under elevated thermal conditions.

DESCRIPTION OF THE PRIOR ART

Many electrical devices which produce heat during operation have a high percentage failure rate during the first year of service. Such devices include capacitors, resistors, and semiconductor devices including diodes, transistors and integrated circuits. Circuits are of particular concern because advances in semiconductor processing and circuit design have led to increased component density on the circuit, with a consequent increase in heat generated per unit area of semiconductor chip surface.

The majority of the electrical devices that will fail during the first year of operation can, however, be eliminated from commercially available products by subjecting the devices to a "burn-in" test. During a burn-in test the devices are subjected to extreme thermal or electrical operating conditions for a short period of time, typically, one to eight weeks, thereby simulating one year of operation under normal conditions. Industry practices generally allow accelerated burn-ins at temperatures exceeding standard burn-in temperatures, providing that temperature control is maintained.

Originally, burn-in tests were conducted in air or nitrogen. Recently, however, as disclosed in U.S. Pat. No. 4,745,354 to Fraser, burn-ins have been conducted with the devices immersed in a non-reactive electrically insulating liquid. The liquid serves to increase the ambient operating temperature of the devices and to dissipate excess heat produced by the operating devices. The liquid used in the Fraser process is unusually expensive and has a significant evaporation rate at the elevated temperatures associated with burn-in tests. Therefore, to prevent extensive losses from evaporation, the liquid is carefully maintained below its boiling point by pumping it over mechanical cooling coils to remove heat generated by the operating devices.

Computer manufacturers also use immersion cooling to dissipate heat from semiconductor devices in operating computers. In such cooling systems, the devices are immersed in a dielectric, low boiling point liquid. During operation the heat generated by the devices causes vapor bubbles of the liquid coolant to form in nucleation sites on the surface of the chip. A portion of the heat generated is absorbed as the latent heat of vaporization of the liquid, the remainder being absorbed by the convection of the liquid at the chip surface. The process is called "nucleate boiling".

The following U.S. Patents are representative of nucleate boiling heat transfer methods and apparatus.

| INVENTOR | U.S. PAT. NO. |
|---|---|
| N. K. G. Aakalu, et al. | 3,741,292 |
| R. C. Chu, et al. | 4,050,507 |
| Frieser, et al. | 4,312,012 |
| R. C. Chu, et al. | 4,709,754 |

In each of the above cited patents, modules having heat generating components such as semiconductor devices are located within a low boiling point dielectric liquid. A vapor space is located above the liquid level. The electronic components heat the liquid causing nucleate boiling at the surface of the electronic components. The R. C. Chu, et. al., U.S. Pat. No. 4,050,507 describes electronic chips having nucleate boiling sites located on at least the back surface of the chip and mounted so that the back surface is exposed and is oriented vertically. The Frieser, et al., U.S. Pat. No. 4,312,012 describes enhancing the nucleate boiling characteristics of silicon devices by forming lattice defects on the backside surface of the device by sandblasting and etching the damaged surface. The R. C. Chu, et al., U.S. Pat. No. 4,709,754 discloses a fin structure with an improved nucleate boiling surface. In general, nucleate boiling cooling technology has been directed at improving the nucleation sites at which boiling commences, rather than maintaining the temperature of the immersion bath or device case.

One problem with nucleate boiling cooling is that the liquids appropriate for immersion cooling exhibit an unexplained hysteresis characteristic, requiring a higher temperature to initiate nucleate boiling than is required to sustain boiling. The superheat required to initiate nucleate boiling may exceed the desired operating temperature of the heat-generating device, potentially damaging it, even though the eventual boiling temperature stabilizes at an acceptable level. The hysteresis effect can be best illustrated by referring to FIG. 1. FIG. 1 is a graph of temperature versus time for the nucleate boiling of immersion fluids. Curve 20 represents the temperature overshoot necessary to initiate nucleate boiling in the immersion fluids used in prior art nucleate boiling cooling systems.

Another problem associated with nucleate boiling cooling is that as heat is dissipated from the device, more and more bubbles are formed, eventually creating a film. The onset of film boiling marks the upper limit of nucleate boiling because the film blocks the liquid from reaching the chip surface, thereby significantly restricting heat transfer from the devices and potentially causing destructive overheating, or thermal runaway, of the devices.

The following publications discuss nucleate boiling and immersion cooling in general. R. A. W. Shock, "Nucleate Boiling in Binary Mixtures", *International Journal of Heat Mass Transfer*, Vol. 20, 1977, pp 701–09. Yokouchi et al., "Immersion Cooling for High-Density Packaging", *IEEE Transactions on Components, Hybrids, and Manufacturing Technology*, Vol. CHMT-12, No. 4, December 1987, pp 643–46.

Problems associated with film boiling can be ameliorated by attaching heat sinks to the heat dissipating surface to increase the heat transfer area. U.S. Pat. No. 4,203,129 to Oktay, et. al. discloses a heat sink containing tunnels so that the attached devices are cooled by nucleate boiling bubbles formed within the tunnels.

However, manufacturers nowadays require burn-in tests to be performed on electrical devices running at high power while the device case temperature is maintained within a very narrow margin. Presently available systems for doing high power burn-ins are extremely expensive and do not have sufficient control to maintain the case temperature within a narrow tolerance. Such burn-in test requirements cannot be met either by the prior art directed to burn-ins, or the prior art directed to nucleate boiling cooling of semiconductor devices operating in computers.

SUMMARY OF INVENTION

The present invention relates generally to a method and apparatus for maintaining electrically operated devices at a predetermined desired temperature by immersing the device in an inert liquid which cools the device by nucleate boiling. The techniques employed by the present invention may be described in the environment frequently found in the semiconductor industry wherein the case temperature of a device is controlled during burn-in. Therefore, the present invention will be described in an environment wherein the temperature of the device is controlled by detecting and controlling the temperature of the case enclosing the device. In such burn-in testing, it is typical for industry burn-in specifications to require the device case to be maintained at a given temperature for an extended period of time; as a practical matter, the case forms a convenient point of attachment for a means to measure temperature.

Briefly described, and in accordance with one embodiment, the invention provides a method for maintaining the case of an immersed electrically operating device at a desired temperature by controlling the rate of nucleate boiling of the immersion liquid during sustained burn-in testing of the device. A heat sink is attached to the device, and the device and heat sink are immersed in a bath of inert liquid having a boiling point lower than the desired case temperature. The device is supplied with electrical power, thereby generating heat which is transferred to the bath by nucleate boiling of the liquid. The device case temperature is monitored until it stabilizes at a temperature between the boiling point of the liquid and the desired case temperature. An inert liquid having a boiling point greater than the desired case temperature is slowly added to the bath to modify the rate of nucleate boiling of the lower-boiling liquid, while simultaneously monitoring the case temperature, until the case temperature stabilizes at the desired case temperature.

A second embodiment of the present invention can be described in an environment wherein the temperature of the device is controlled by detecting and controlling the temperature of fluids in which the device is immersed, in other words, by detecting and controlling the ambient temperature of the device. In such burn-in testing, it is typical for industry burn-in specifications to require the ambient temperature to be maintained at a given temperature for an extended period of time. Thus, in accordance with this embodiment, the device is immersed in a bath of a high-temperature inert liquid having a boiling point greater than the desired ambient temperature; a heating element is also immersed in the bath. The heating element heats the high-temperature liquid to a temperature equal to the desired ambient temperature. The device is then supplied with electrical power while a low-temperature inert liquid having a boiling temperature below the desired ambient temperature is slowly added to the bath to initiate nucleate boiling of the low-temperature fluid so as to prevent the ambient temperature from exceeding the desired temperature. The ambient temperature is monitored until the bath stabilizes at the desired ambient temperature.

In a third embodiment, the invention provides a method to maintain an electrically operating device within a predetermined range of minimum and maximum device temperatures during high temperature reverse bias burn-in. The device, supplied with a means for monitoring device temperature, is immersed together with a heating element in a high-temperature inert liquid having a boiling point greater than the maximum device temperature. The bath is then heated with the heating element, and the device temperature is monitored, until it stabilizes at a temperature below the minimum device temperature. The device is gradually powered to the required reverse voltage until the device temperature stabilizes at a temperature higher than the minimum temperature. Thereafter, a low-temperature inert liquid having a boiling point less than the desired maximum device temperature is added to the bath to initiate nucleate boiling of the low-temperature fluid; the device temperature is monitored to ensure that it stays within the minimum and maximum temperatures.

It is an object of the present invention to maintain within a narrow margin the case temperature of an electrically operating device immersed in a boiling inert liquid by controlling the rate of vaporization of the immersion liquid.

It is another object of the present invention to prevent destructive overheating of an electrically operating device immersed in a boiling inert liquid during a burn-in test.

It is another object of the present invention to provide an uncomplicated method and apparatus for maintaining a desired case temperature of an electrically operating device undergoing a burn-in test.

It is another object of the present invention to provide a method and apparatus for recycling the inert liquid.

It is another object of the present invention to provide an uncomplicated method and apparatus for maintaining within a narrow margin the ambient temperature of an electrically operating device.

It is another object of the present invention to provide an uncomplicated method and apparatus for maintaining within a narrow margin the device temperature of an electrically operating device undergoing a high temperature reverse bias burn-in test.

Other objects, advantages and features of the present invention will become apparent from the following specification when taken in conjunction with the accompanying drawings.

BRIEF DESCRIPTION OF THE DRAWINGS

FIG. 6 is a graph useful in illustrating temperature control in a second embodiment of the present invention, high temperature reverse bias (HTRB) burn-in.

FIG. 7 is a perspective view of a second embodiment of the present invention, exemplifying apparatus used for a high temperature reverse bias (HTRB) burn-in.

DESCRIPTION OF THE PRE D EMBODIMENT

Figure 1:
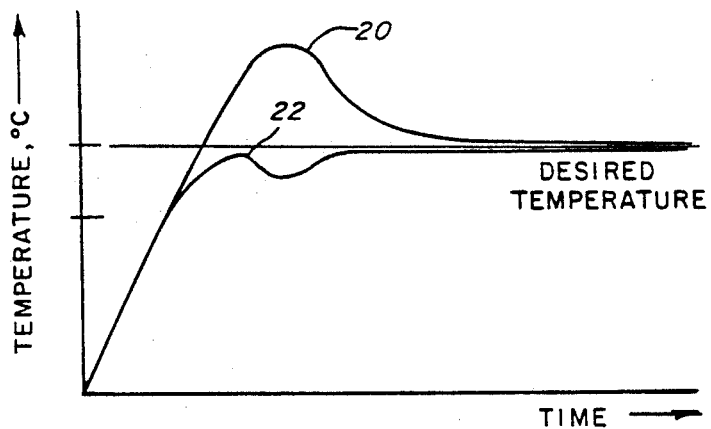
FIG. 1 is a graph useful in comparing the present invention with the prior art.

Referring generally to the first embodiment illustrated in FIGS. 2, 3, 4, and 5, burn-in unit 1 includes a generally rectangular, substantially closed tank 2 containing transistors 3 to be subjected to a burn-in test; if the tank is sealed, it should be provided with a vent or other means to equalize internal tank pressure with the atmospheric pressure. Other devices suitable for burn-in testing according to the present invention include for example rectifiers, resistors and diodes. Transistors 3 are supplied with electrical power from power source 6 by means of electrical cord 7. To monitor the transistor case temperature during the burn-in test, thermocouples 5 are attached to a representative number of transistors 3 at a point on the transistor case 13 nearest the die, or source of heat generation. Thermocouple readings are recorded by temperature recorder 10. Alternatively, the case temperature can be monitored by measuring the infrared radiation given off by transistors 3 during the burn-in test.

Figure 3:
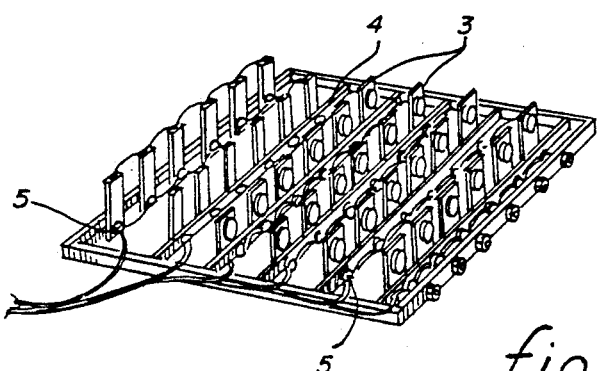
FIG. 3 is a close-up view of the electrically operating devices tested in the burn-in unit of FIG. 2.

As illustrated in detail in FIG. 3, transistors 3 are attached to copper heat sink 4. Heat sink 4 provides an increased heat transfer area for transistors 3, to prevent destructive overheating or thermal runaway of the transistors and to keep the transistor case temperature uniform. However, heat sinks are not necessary if the particular devices under test transfer heat efficiently. Furthermore, depending on the particular geometry of the device, a heat sink may actually make the device hotter by preventing cooling means from reaching the device.

Figure 4:
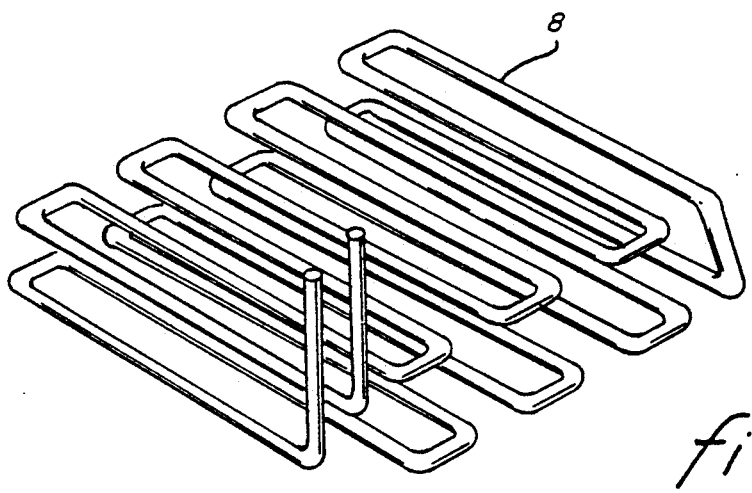
FIG. 4 is a close-up view of the cooling coils used in the burn-in unit of FIG. 2.
Figure 5:
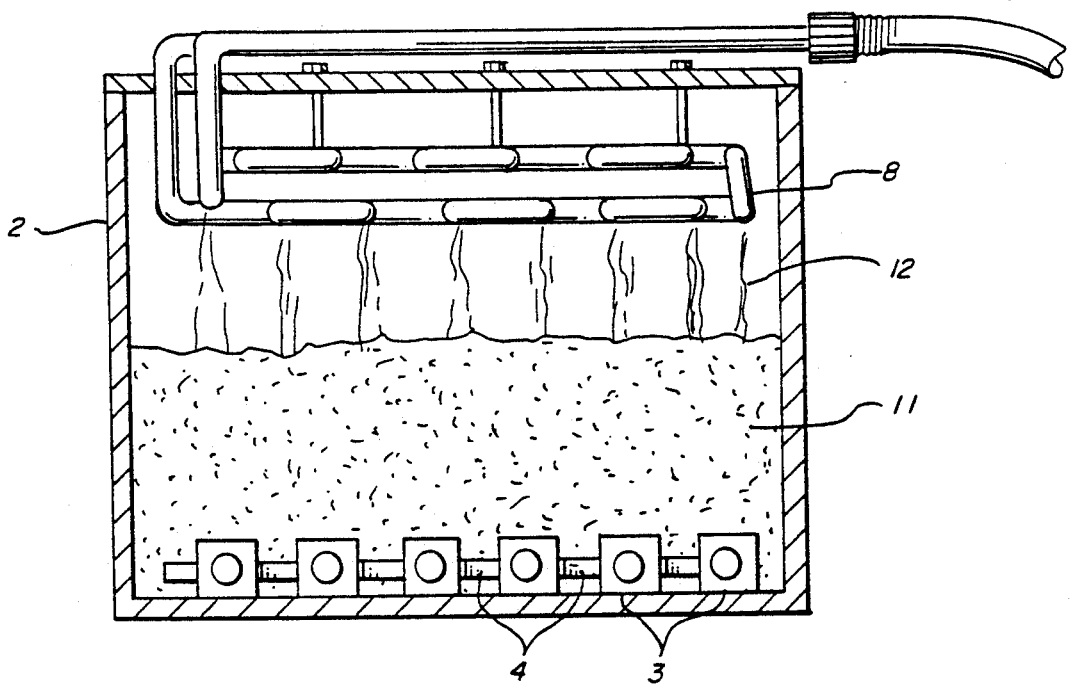
FIG. 5 is a perspective view of the burn-in unit of FIG. 2 in operation.

The transistor/heat sink assembly is immersed in a bath of an inert liquid such as a perfluorinated organic liquid 9, having a boiling point less than the desired burn-in case temperature. Power is supplied to transistors 3 and the temperature of transistor cases 13 is monitored. During operation transistors 3 are cooled by transferring heat to the bath, initiating nucleate boiling of liquid 9, as indicated by reference numeral 11 in FIG. 5. A large portion of the heat transferred from transistors 3 is absorbed by liquid 9 as the latent heat of vaporization; the remainder is absorbed by convection of the liquid. The rising vapor bubbles of liquid 9 are condensed by cold water contained in two rows of ½ inch copper cooling coils 8 located in tank 2 above the bath (FIG. 4). Condensing liquid streams 12, fall back into liquid bath 9 for continued cooling of transistors 3 by nucleate boiling. It is important that the temperature of the cooling coil be above the dew point of the atmosphere in the tank to prevent water from condensing inside the tank and reacting in the bath with the electrically operating device.

The temperature of transistor cases 13 increases to a stabilization temperature between the boiling point of liquid 9 and the desired case temperature. When the stabilization temperature has been reached, an inert liquid (preferably, a perfluorinated organic liquid miscible with the first liquid) having a boiling point greater than the desired case temperature, is slowly added to tank 2 while the transistor case temperature is continuously monitored. The second, higher-boiling liquid decreases the rate of heat transfer from transistors 3 by diluting the lower boiling fluid, thereby effectively quenching the high heat transfer rate caused by nucleate boiling of the first fluid. Therefore, the transistor case temperature will rise. When the case temperature reaches the desired temperature, addition of the second fluid is discontinued, and the case temperature will remain at the desired temperature.

After the desired case temperature has been reached, the burn-in test continues for the required period of time. The temperature of transistors 3 is closely monitored; if the temperature begins to increase above the desired case temperature, an additional amount of the first inert liquid is added to tank 2 to cool the transistor cases by nucleate boiling of the lower-boiling liquid. If too much of the first inert liquid is inadvertently added, this case temperature will drop below the desired case temperature; in that situation, additional higher boiling inert liquid is added to quench the nucleate boiling cooling from evaporation of the first inert liquid. The desired case temperature can be maintained within a margin of ±5° C. by careful monitoring of the device case temperature and selective addition to the bath of the two inert liquids; preferably, electrically or computer controlled injectors are used so that micro adjustments can be made to the fluid mixture. When the burn-in test has been completed, the two inert liquids can be separated by the usual distillation procedures and recycled for use in other burn-in tests.

Figure 2:
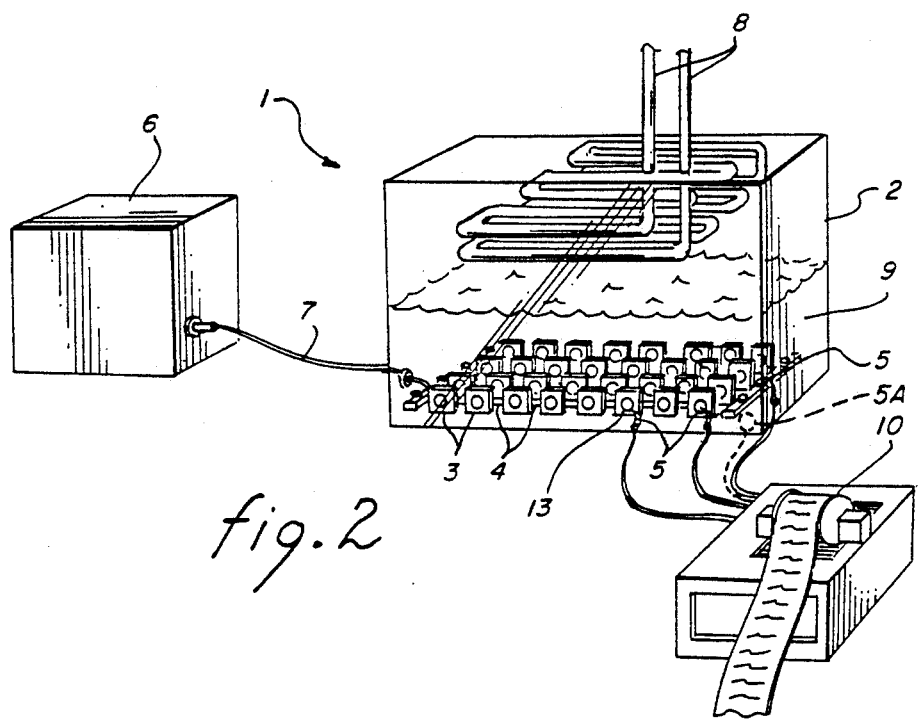
FIG. 2 is a perspective view of a first embodiment of a burn-in unit including the present invention.

As an alternative to monitoring device or device case temperature, the temperature of the immersed device can be approximately monitored and/or controlled by placing thermocouples 5A immersion liquid or bath 9, as shown by dashed lines in FIG. 2, rather than on the device case, thus monitoring and controlling the ambient temperature of the immersed device; the thermocouple readings can be recorded as described above. The ambient temperature can be controlled within a narrow margin by selective addition of the high—and low—boiling inert fluids in the manner described above.

As indicated by curve 22 of FIG. 1, the present invention avoids the hysteresis and device-overheating problems associated with the prior art because the temperature to initiate nucleate boiling of the lower-boiling immersion fluid is less than the desired case temperature; the higher-boiling fluid in fact does not approach its boiling point.

Figure 6:
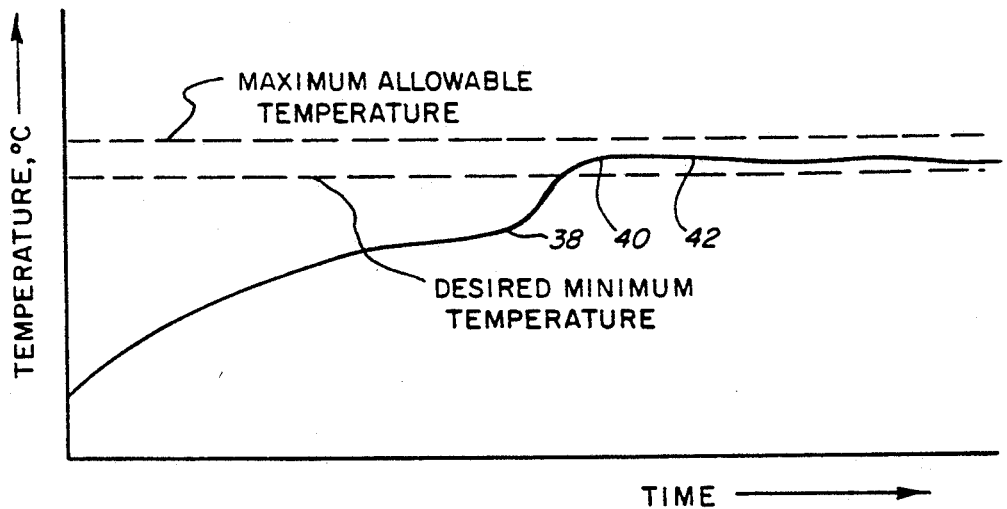
Figure 7:
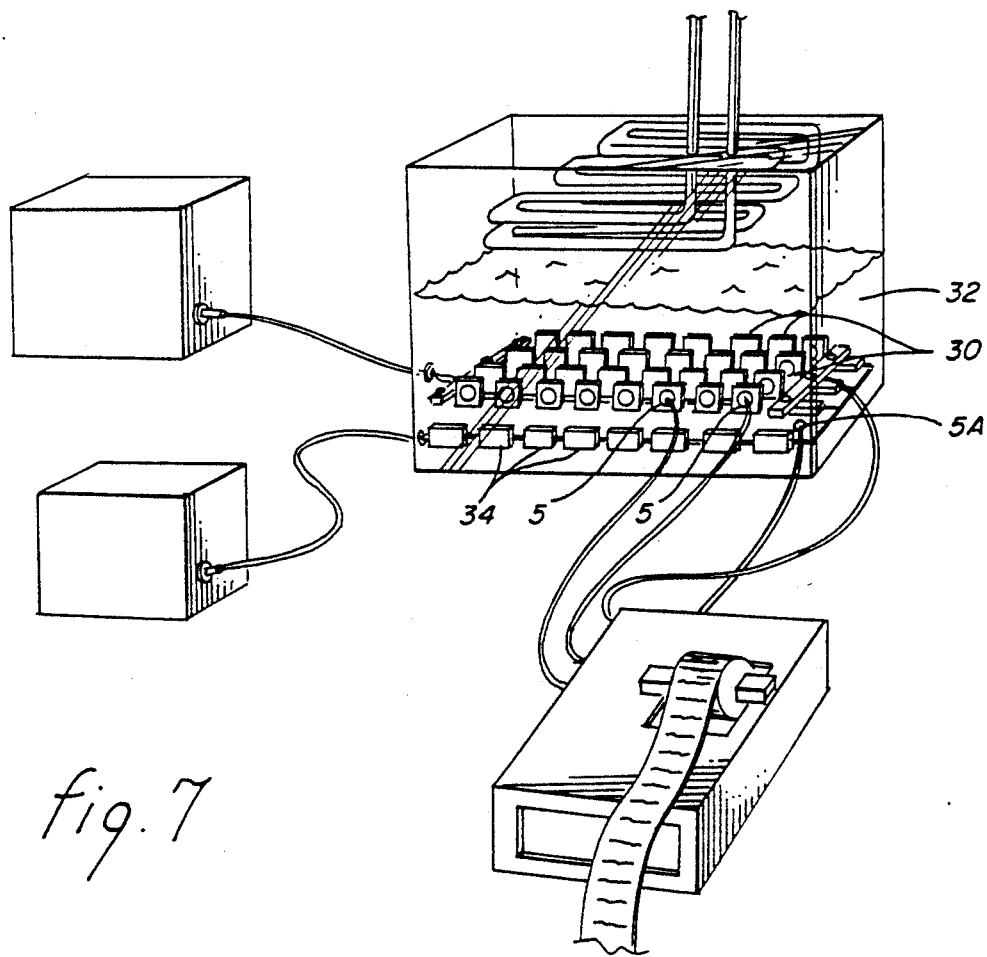

FIGS. 6 and 7 illustrate another embodiment of the present invention, namely, high-temperature reverse bias (HTRB) burn-in. In general, the temperatures required for HTRB burn-ins, often specified as a range of temperatures between a minimum and maximum temperature, cannot be achieved by heat supplied solely from the electrically operating devices under test because the devices are being reverse biased and thus do not generate as much energy as would be generated under normal operation. Therefore, for HTRB burn-ins, devices 30 are immersed in a high-temperature inert fluid 32, typically a perfluorinated organic liquid, having a boiling point greater than the specified maximum burn-in temperature, which is commonly either a specific device or device case temperature, or a specific ambient temperature such as a bath temperature. Thus, either devices 30 or high-temperature fluid 32 will be supplied with a means for monitoring temperature, such as thermocouple 5.

Also immersed in fluid 32 is a heating element such as resistor or resistors 34, preferably located below devices 30, which resistors have a power supply 36. Resistors 34 heat fluid 32 until the temperature being monitored, either the device or the bath temperature, stabilizes at a temperature below the minimum specified temperature (as shown by reference numeral 38 in FIG. 6). At that point, devices 30 are gradually powered to the required reverse voltage, and temperature is monitored, preferably while a low-temperature inert fluid having a boiling point less than the specified minimum burn-in temperature is added to the bath to initiate nucleate boiling of the low-temperature fluid; alternatively, the low-temperature fluid can be added after the temperature being monitored reaches at least the desired minimum temperature. Addition of the low-temperature fluid, which is typically a perfluorinated organic liquid, continues until the temperature (indicated by reference numeral 40 in FIG. 6) reaches at least the desired minimum temperature; the low-temperature fluid serves to keep the monitored temperature (indicated by line 42 of FIG. 6) below the desired maximum burn-in temperature. The specified temperature, whether of the device or ambient, can be controlled within a narrow margin by selected addition of the high— and low— boiling inert fluids in a manner analogous to that described above with respect to the first embodiment.

Example 1: Case Temperature Controlled Burn-In

The following example describes a two-week burn-in test of rectifier diodes supplied with 50 amps of electrical power. The required case temperature was 100° plus or minus 5° C. Twenty-two rectifier diodes were attached to copper heat sinks. Thermocouples were attached to three diodes at a point on the diode case nearest the source of heat. The diode/heat sink assembly was then placed in a burn-in tank. A perfluorinated organic liquid having a boiling point of 84° C. (D/80, manufactured by Ausimont Galden), was added to the tank until the diodes were completely immersed. The diodes were supplied with 50 amps of electrical power and the diode case temperature was monitored and recorded. The diode case temperature stabilized at a temperature of approximately 94° C. At that point, a perfluorinated organic liquid having a boiling point of 175° C. (DO$_2$, manufactured by Ausimont Galden), was slowly added to the tank while the diode case temperature was monitored, until it reached the desired case temperature of 100° C. The diode case temperature was monitored for the burn-in period of two weeks; several times, the diode case temperature increased above the desired case temperature of 100° C. To decrease the case temperature to the desired to the desired level, D/80 was slowly added to the tank until the diode case temperature dropped to 100° C. During the burn-in test, vaporized D/80 was condensed by copper cooling coils containing 18° C. water and located above the bath. The condensed D/80 liquid streams dropped back into the bath.

Example 2: Ambient Temperature Controlled Burn-In

The following example describes a 160 hour ambient burn-in test of an immersed integrated circuit supplied with 0.5 watts of electrical power. The required ambient temperature of the surrounding fluid was 125° C. Two integrated circuit devices were inserted into test sockets on a burn-in board assembly, with a thermocouple placed near the devices to monitor the temperature of the immersion fluid or bath. The burn-in assembly, connected to a first power supply, was then placed in a burn-in tank above heating elements powered by a second power supply. A perfluorinated organic liquid having a boiling point of 175° C. (DO2 manufactured by Ausimont Galden) was added to the tank until the devices were completely immersed. The integrated circuits were then supplied with 0.5 watts of electrical power and the ambient temperature was monitored and recorded. The perfluorinated liquids were then heated by the heating elements until the ambient temperature exceeded 125° C., at which time the lower boiling point perfluorinated organic liquid having a boiling point of 84° C. (D/80 manufactured by Ausimont Galden) was slowly added to the tank while the ambient or immersion fluid temperature was monitored until it reached the desired ambient temperature of 125° C. The ambient temperature was monitored for the burn-in period of 160 hours; several times, the ambient temperature increased above 125° C. To decrease the ambient temperature to the desired level, D/80 was slowly added to the tank until the ambient temperature again dropped to 125° C. During the burn-in test, vaporized immersion fluid was condensed by copper cooling coils located above the bath which coils contained 18° C. water. The condensed immersion fluid streams dropped back into the bath from the coils.

Example 3: High Temperature Reverse Bias Burn-In

The following example describes a 1,000 hour high temperature reverse bias test of Schottky rectifier diodes supplied with 5.4 watts of electrical power. The required case temperature was 150° C. minimum. Nine Schottky rectifier diodes were attached to a wire rack biased with the reverse voltage. Thermocouples were attached to two diodes at a point on the diode case nearest the source of heat. The diode/wire rack assembly was then placed in a burn-in tank above a heating element powered by a separate power supply. A perfluorinated organic liquid having a boiling point of 175° C. (DO2 manufactured by Ausimont Galden) was added to the tank until the diodes were completely immersed. The perfluorinated liquid was first heated to 140° C. by supplying power to the heating elements. The diodes were then supplied with 5.4 watts of electrical power, while a second perfluorinated organic liquid having a boiling point of 84° C. (D/80, manufactured by Ausimont Galden) was slowly added to the tank, while the diode case temperature was monitored, until it reached the desired case temperature of 151° C. The diode case temperature was monitored for the burn-in period of 1,000 hours; several times, the diode case temperature increased above 152° C. To decrease the case temperature to the desired level, D/80 was slowly added to the tank until the diode case temperature again dropped to 151° C. During the burn-in test, vaporized immersion fluid was condensed by copper cooling coils located above the bath which coils contained 18° C. water. The condensed immersion fluid streams dropped back into the bath.

It is to be understood that the present invention is not limited to the particular construction and arrangement of parts disclosed and illustrated herein, but embraces all such modified forms thereof which are within the scope of the following claims. For example, it is important to understand that heating elements such as resistors 34 can also be used in processes such as the first embodiment described above, to increase the burn-in temperature above a standard burn-in temperature, thus accelerating the entire burn-in process and greatly decreasing device test time.

We claim:

1. An apparatus for maintaining an electrically operating device at a desired ambient temperature during operation of the device, comprising:
   a. a tank to contain the device while it is being electrically operated;
   b. a first inert liquid, having a boiling point less than the desired ambient temperature, said first inert liquid partially filling the tank and completely covering the device to form a bath;
   c. means for heating said bath while said device is being electrically operated;
   d. a second inert liquid, having a boiling point greater than the desired ambient temperature, said second inert liquid being selected to modify the rate of nucleate boiling of the first inert liquid, said second inert liquid being mixed with said first inert liquid;
   e. means connected to said device for electrically operating the device, thereby generating heat which is transferred to the bath by nucleate boiling of the first inert liquid; and
   f. means for monitoring the bath temperature.

2. The apparatus of claim 1, wherein both the high-boiling inert liquid and the low-boiling inert liquid are perfluorinated organic liquids.

3. An apparatus for maintaining an electrically operating device within a predetermined range of minimum and maximum temperatures, comprising:
   a. a tank to contain the device while it is being electrically operated;
   b. a high-boiling inert liquid having a boiling point greater than the maximum temperature, said high-boiling inert liquid partially filling the tank and completely covering the device to form a bath;
   c. means for heating the bath and the device while said device is being electrically operated;
   d. a low-boiling inert liquid having a boiling point less than the maximum temperature, said low-boiling inert liquid being selected so as to achieve nucleate boiling upon contacting said device and being mixed with said high-boiling insert liquid, thereby maintaining the device temperature within the predetermined range of minimum and maximum temperatures;
   e. means connected to said device for electrically operating the device; and
   f. means for monitoring the device temperature.

4. The apparatus of claim 3, wherein both the high-boiling inert liquid and the low-boiling inert liquid are perfluorinated organic liquids.

5. The apparatus of claim 3, wherein the means for electrically operating the device include means to operate the device in a reverse bias mode.

* * * * *